United States Patent [19]

Kim et al.

[11] Patent Number: 5,428,057

[45] Date of Patent: Jun. 27, 1995

[54] NEW MALEIMIDE MODIFIED EPOXY RESIN AND A METHOD FOR THE PREPARATION THEREOF

[75] Inventors: Whan G. Kim, Seoul; Tai Y. Nam, Kyungki, both of Rep. of Korea

[73] Assignee: Cheil Industries, Inc., Taegu, Rep. of Korea

[21] Appl. No.: 693,668

[22] Filed: Apr. 30, 1991

[30] Foreign Application Priority Data

Jun. 30, 1990 [KR] Rep. of Korea ............... 90-9858
Jun. 30, 1990 [KR] Rep. of Korea ............... 90-9859

[51] Int. Cl.$^6$ ............................................. C08L 63/00
[52] U.S. Cl. ................................. 523/443; 523/466; 525/476; 525/481; 525/482; 525/484; 525/486; 525/487; 525/488; 525/502; 528/96; 528/114
[58] Field of Search ............... 523/443, 466; 525/476, 525/481, 482, 484, 486, 487, 488, 502; 528/96, 114

[56] References Cited

U.S. PATENT DOCUMENTS

| | | | |
|---|---|---|---|
| 4,288,359 | 9/1981 | Graham | 528/322 |
| 4,871,832 | 10/1989 | Saito et al. | 528/96 |
| 4,985,529 | 1/1991 | Saito et al. | 528/96 |

FOREIGN PATENT DOCUMENTS

| | | |
|---|---|---|
| 48-67395 | 9/1973 | Japan . |
| 54-142298 | 11/1979 | Japan . |
| 58-89619 | 5/1983 | Japan . |
| 59-227924 | 12/1984 | Japan . |
| 62-195015 | 8/1987 | Japan . |
| 62-212419 | 9/1987 | Japan . |
| 62-227917 | 10/1987 | Japan . |
| 62-270618 | 11/1987 | Japan . |
| 63-35626 | 2/1988 | Japan . |
| 62-37118 | 2/1988 | Japan . |

OTHER PUBLICATIONS

Abstract of Japanese Laid Open Patent Publication No. 58-215452, dated Dec. 14, 1983, applicant is Toshiba (List continued on next page.)

*Primary Examiner*—Frederick Krass
*Attorney, Agent, or Firm*—Merchant, Gould, Smith, Edell, Welter & Schmidt

[57] ABSTRACT

The present invention relates to a modified epoxy resin, a method for the preparation thereof and an epoxy resin composition using the modified epoxy resin. In particular, it relates to a modified epoxy resin of the general formula (I) which is prepared by incorporating a monomaleimide having a carboxy group useful as a heat resistance-improving agent of a resin composition containing an epoxy resin and maleimides into an epoxy resin, and an epoxy resin composition for sealing a semiconductor element having the improved heat resistance and moldability by the modified epoxy resin.

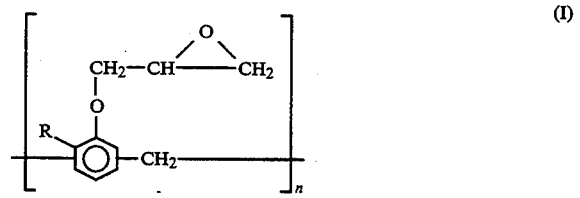

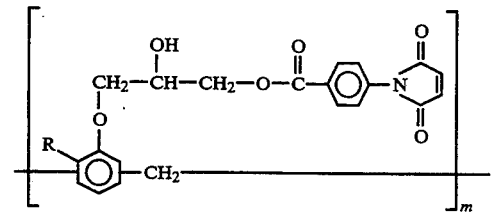

wherein,
R represents a hydrogen atom or an alkyl group having from 1 to 10 carbon atoms ($C_1$ to $C_{10}$), and n is 0 to 100, and m is 1 to 100.

11 Claims, No Drawings

OTHER PUBLICATIONS

Chemical K.K., inventor is Tsutomu Nagata.
Abstract of Japanese Laid Open Patent Publication No. 59-64660, dated Apr. 12, 1984, applicant is Toshiba Chemical K.K., inventor is Soku Koike.
Abstract of Japanese Laid Open Patent Publication No. 62-53324, dated Mar. 9, 1987, applicant is Agency of Ind. Science & Technology, inventor is Seiichi Hino.

"Biaspartimide-diamines as Curing Agents for Expoy Resins" by Devendra Kumar and Alka D. Gupta, from *J. Macromol. Sci.-Chem.*, A22 (8), pp. 1101-1107, copyright 1985.

"DSC Evaluation of Epoxy and Polyimide-Impregnated Laminates (Prepregs)" by L. T. Pappalardo, from *Journal of Applied Polymer Science*, vol. 21, pp. 809-820, copyright 1977.

NEW MALEIMIDE MODIFIED EPOXY RESIN AND A METHOD FOR THE PREPARATION THEREOF

FIELD OF THE INVENTION

The present invention relates to a new modified epoxy resin, a method for the preparation thereof and an epoxy resin composition using the above modified epoxy resin. More specifically, the present invention relates to a new modified epoxy resin in which monomaleimide having a carboxy group is incorporated into an epoxy resin, a method for the preparation thereof, and an epoxy resin composition for sealing a semiconductor element having improved heat resistance and moldability by enhancing a compatibility with an epoxy resin by using the modified epoxy resin.

BACKGROUND OF THE INVENTION

A cured substance by using an epoxy resin and other additives exhibits generally the excellent thermal, mechanical, electrical properties and the adhesion property, and therefore, it has been used widely in various industry.

Particular, a molding material in which an epoxy resin and various fillers are combined has been used widely as an adhesion or insulation material of an electronics or electrical machine or a construction material, and it plays an important part in satisfying a demand of the miniaturization of the installation, and an improvement of the reliability and the productivity.

Recently, in the electric and electronic field and the field of the transport machine such as an airplane and a motor, the material having more better heat resistance has been required due to high performance, miniaturization and light weight of machine, and with the steady growth of a semiconductor industry, the package element for protecting the semiconductor element from the moisture and the impact from outside has been investigated. Generally, there are two package modes; one includes the use of ceramic or metal and the other includes the use of the epoxy resin or the silicone resin.

However, the plastic package mode using the epoxy resin has been mainly used in view of the productivity and cost.

Meanwhile, recently, since the size of semiconductor chip is increased and the width of wiring is narrowed with the high integration, the improvement of the heat resistance and the moisture resistance has been required in order to reduce the heat stress caused in using the product and to improve reflow property.

In particular, according to the trend of surface mounting technology since in the semiconductor chip the package should be withstand the soldering process which is effected at the high temperature above 215° C. in contrast with DIP (Dual In-line Package) mode of the prior art, the need on the heat resistance has been increased.

In the light of these requirements, although the epoxy resin of the prior art has the excellent mechanical and electrical properties and it has advantages in view of the productivity and cost, it does not have the sufficient heat resistance.

As a method overcoming these problems, there is a method which uses polyimide resin having an excellent heat resistance instead of an epoxy resin. However, in the method, it is difficult to mold polyimide resin due to its infusibility and the polyimide resin is unpractical in cost. Also, polymaleimide represented by N,N'-4,4'-diphenylmethane bismaleimide having high heat stability requires the conditions of long time and high temperature for the complete curing.

Meanwhile, Japanese Laid-open Patent Publication No. (Sho) 48-67395, 54-142298, 62-35410, 62-195015, 62-53324, 62-212419, 62-270618 and 63-37118 and *J. Macromol, Sci. Chem.* A22(8), PP 1101~1107(1985) disclose that the thermal property of the resin composition is improved by curing the epoxy resin by a reaction initiator having a functional group such as —COOH, —OH, and —NH in the terminal of imide backbone. However, in this method, there is a limitation in increasing the amount of imide contributing to the improvement of heat resistance.

As another method, there is a method in which a prepolymer is prepared by reacting a substance having an amino group such as aminophenol or diaminodiphenylmethane in its terminal with the available maleimides, and thereafter, the remaining amino groups are reacted with the epoxy groups in the resin composition by adding the prepolymer in the resin composition [See: Japanese Laid-open Patent Publication No. (Sho) 58-215452, 58-89619, 59-64660, 59-227924, 62-227917, U.S. Pat. No. 4,288,359 and *J. Appl. Polym. Sci.* Vol 21, PP 809~820(1977)]. However, in this case, it is difficult to control the degree of reaction and the weight of imide should be limited.

Also, a method which enhances a heat resistance of a cured product by improving a curing property by combining an epoxy resin and an amine compound in polyfunctional polymaleimide has the problems on a storage stability at room temperature (20° C.~30° C.) and an uniform curing reaction.

Further, in order to increasing a glass transition temperature of an element for a plastic package, Japanese Laid-open Patent Publication No. (Sho) 54-142298 and 58-215452 proposed a resin composition using an aromatic imide compound. However, the resin composition for a semiconductor using the aromatic imide compound has low compatibility between it and the epoxy resin and low moldability, and therefore, it has many problems on the improvement of performance.

Accordingly, the purpose of the present invention is to provide a new modified epoxy resin to be modified by maleimide to be added in a heat-resistant resin composition in order to improve a thermal property and a method for the preparation thereof.

The other purpose of the present invention is to provide a resin composition for sealing a semiconductor element having the excellent heat resistance and moldability by using the modified epoxy resin to be modified by the maleimide in a resin composition for sealing an element for a plastic package.

SUMMARY OF THE INVENTION

In order to achieve the above purposes, the present invention is characterized in that the modified epoxy resin essentially consisting of epoxy resin and maleimide resin is obtained by reacting the epoxy group of the epoxy resin and the maleimide group of the maleimide resin in the ratio of 1:1 to 3:1, and that the epoxy resin composition having the excellent heat resistance and moldability is obtained by containing therein the above modified epoxy resin in the amount of 5 to 50 weight % on the basis of the entire resin composition as a heat resistance-improving agent.

That is, the present invention relates to a new modified epoxy resin having the following general formula (I) which is obtained by reacting the epoxy resin and the maleimide resin in the proper ratio.

Also, the present invention relates to an epoxy resin composition containing a maleimide-modified epoxy resin of the general formula (I) as a heat resistance-improving agent in an epoxy resin composition for sealing a semiconductor element containing an epoxy resin, a curing agent, a curing promoter, a stress lowering agent and a heat resistance-improving agent.

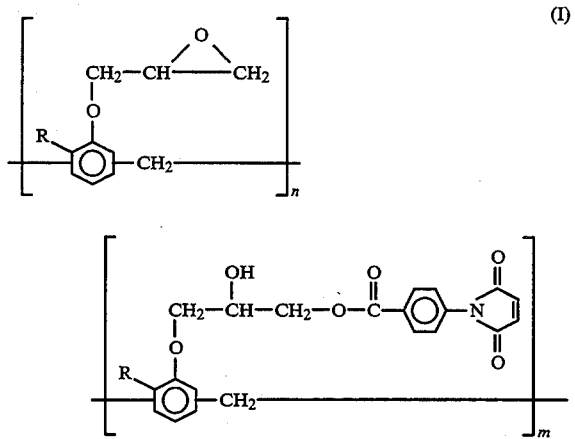

(I)

wherein,

R represents a hydrogen atom or an alkyl group having from 1 to 10 carbon atoms ($C_1$ to $C_{10}$), and n and m are 1 to 100, respectively.

DETAILED DESCRIPTION OF THE INVENTION

The new modified epoxy resin of the general formula (I) which is an additive of a freshly synthesized heat-resistant resin composition in the present invention is prepared by reacting a monomaleimide of the general formula (II) with an epoxy resin solution of the general formula (III) at 120° to 200° C. so that the maleimide group can be incorporated into the epoxy group in the epoxy resin.

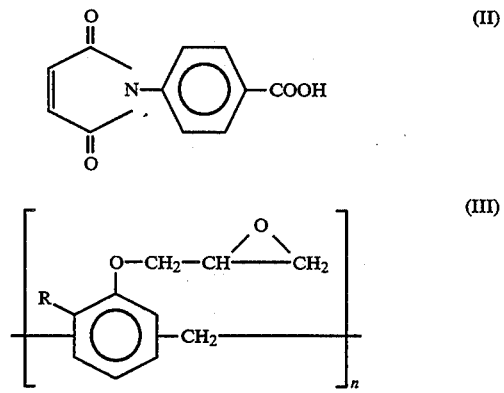

(II)

(III)

wherein, R and n are as defined in the general formula (I).

The specific processes for preparing the new modified epoxy resin of the present invention are as follows.

[The synthesis of a monomaleimide]

In order to synthesize a monomaleimide to be used for preparing a modified epoxy resin, N-(p-carboxyphenyl) maleimide or N-(m-carboxy phenyl) maleimide is synthesized by condensing maleic anhydride and p-amino benzoic acid or m-amino benzoic acid.

That is, the monomaleimide of the general formula (II) is obtained as yellow powders by adding dropwise the equivalent mole of maleic anhydride into amino benzoic acid dissolved in dimethylformamide (DMF) solvent, stirring the reactants under nitrogen atmosphere to form maleiamic acid, dehydrating and cyclizing the formed maleiamic acid by using acetic anhydride and sodium acetate, treating the resulting product with ice-water and drying it.

[The preparation of the modified epoxy resin]

The modified epoxy resin of the general formula (I) is prepared by reacting the epoxy resin solution of the general formula (III) and the monomaleimide of the general formula (II), if desired, in solvent in the ratio of the epoxy group in the epoxy resin to the maleimide group to be incorporated of 1:1 to 3:1.

According to the present invention, the modified epoxy resin is prepared by changing the ratio of the epoxy group in the epoxy resin to the maleimide group (epoxy group/maleimide group) into 1/1, 3/2, 2/1, and 3/1. As a result, when the ratio of the epoxy group/the maleimide group exceeds 1/1, since the amount of monomaleimide is high, the unreacted maleimide groups are remained in the modified epoxy resin, and due to the loss of the epoxy groups, since the modified epoxy resin does not have the epoxy groups to be bonded with the epoxy resin in the heat-resistant resin composition, the bonding property of the cured product is deteriorated, and thus, the modified epoxy resin acts only as a compatible agent without any help on the improvement of the thermal property of the heat-resistant resin composition.

Also, when the ratio of the epoxy group to the maleimide group is up to 3/1, since the amount of monomaleimide is low, the modified epoxy resin does not exhibit good effects on the improvement of the physical properties of the heat-resistant resin composition. Accordingly, it is preferred to incorporate the maleimide group into the epoxy group in the ratio of the epoxy group to the maleimide group of 1 to 3:1.

Now, the method for preparing the modified epoxy resin of the present invention will specifically described in the following.

The modified epoxy resin can be prepared for a direct melting method or a reaction in a solvent.

That is, the modified epoxy resin is obtained as a brown solid by heating the epoxy resin at 120° to 200° C. to form a liquid, adding the previously prepared N-carboxyphenylmaleimide in a small amount therein, stirring the reactants for 20 to 60 minutes and cooling it.

For the uniform dispersion reaction of N-carboxyphenylmaleimide, the finely-grinded epoxy resin is mixed with N-carboxyphenylmaleimide and the reactants are melted for 5 to 20 minutes. However, since the reaction proceeds rapidly, it takes care of the curing of the resin mixture per se with the lapse of time.

Meanwhile, the above reaction can be effected in a solvent. As a suitable solvent, a polar solvent such as 1,4-dioxane, N,N-dimethylformamide, N,N-dimethylacetamide, and N-methyl-2-pyrolidone can be used. The epoxy resin dissolved in the solvent is stirred at 120° to 200° C. while N-carboxyphenylmaleimide solution in the solvent is added for 5 to 10 minutes, and a total reaction time is 30 minutes to 3 hours. Thereafter, the resulting product is treated with a distilled water to form a precipitate, and the precipitate is sufficiently washed to obtain the modified epoxy resin as reddish-brown powders.

In this case, since the reaction in the solvent can obtain easily the sample through a uniform reaction while the remaining solvent after treating, in particular, the solvent having high boiling point (bp) is remained in the fraction of the cured sample, and thus, it affects the strength and the glass transition temperature (Tg), it is preferred to use a direct melting method in the present invention.

Meanwhile, thus obtained reaction product is identified by IR, and in this case, carboxyphenylmaleimide exhibits an absorption due to the hydrogen bond of carboxylic acid at 3210 $cm^{-1}$ and CH stretching of double bond at 3100 $cm^{-1}$. Also, a strong absorption due to the presence of the imide group is exhibited at 1770 to 60 and 1730 to 20 $cm^{-1}$, and a strong C—O stretching vibration of an aromatic acid is exhibited separately at 1700 $cm^{-1}$.

Moreover, the modified epoxy resin exhibits an absorption due to the hydroxy group at 3500 $cm^{-1}$ and the imide group exhibits an absorption at 1720 $cm^{-1}$ which is a distinctive ester peak of imide and epoxy.

[The heat-resistant resin composition]

The heat-resistant resin composition containing the above modified epoxy resin as an additive is described in the following.

As the heat-resistant resin composition containing the above modified epoxy resin of the present invention as an additive, an epoxy resin composition essentially consisting of an epoxy resin and a maleimide resin is used. The epoxy resin is selected from diglycidyl ether of bisphenol A, phenol novolac-like epoxy resin and cresol novolac-like epoxy resin, and the maleimide compound is known and includes, for example, a bismaleimide compound such as MB 3,000, MB 3,000 H, MB 7,000, and MB 256,276 available from Mitsubishi Petrochemical Co., Ltd., and a multifunctional maleimide such as MP 2000X available from Mitsubishi Petrochemical Co., Ltd. and Bestlex A-4L available from Nippon Shinetsu Chemical Co., Ltd.

The maleimide-modified epoxy resin which is a modified epoxy resin of the present invention is used in the amount of 5 to 50 weight % on the basis of the entire resin composition. In the case of less than 5%, the heat-resistance is deteriorated, and in the case of more than 50%, there are problems in the mechanical property and cost.

Further, as a curing agent, phenol novolac resin is used, and as a curing catalyst, tertiary amines, tertiary amine salts, quarternary ammonium salts, imidazols and organic phosphines are used. These curing agent and curing catalyst are used to reduce the curing time and to improve the moldability and the suitable ratio of combination is in the range of 0.1 to 3 weight % on the basis of the weight of the entire resin composition.

Meanwhile, in the preparation of the resin composition in order to provide the thermal property with the epoxy resin, maleimide is mixed in the suitable ratio in addition to the modified epoxy resin and the curing agent, heated and cured it at the suitable temperature of 120° to 200° C. and post-cured for several hours at 200° C. to form a heat-resistant resin composition having an improved heat-resistance.

[The resin composition for sealing a semiconductor element]

On the basis of the preparation of the heat-resistance resin composition, the epoxy resin composition for sealing a semiconductor element according to the present invention is specifically illustrated in the following.

The present invention is characterized in that the epoxy resin composition for sealing a semiconductor element having the excellent heat resistance and the improved moldability due to the enhancement of the compatibility is prepared by using the maleimide-modified epoxy resin of the general formula (I) as a heat resistance-improving agent in the epoxy resin composition for sealing a semiconductor element. The preferred composition of the resin composition of the present invention is as follows.

| an epoxy resin | 0~15 weight % |
| a maleimide-modified epoxy resin | 0.1~30 weight % |
| a curing agent | 4~10 weight % |
| a curing catalyst | 0.1~0.8 weight % |
| a coupling agent | 0.1~2.0 weight % |
| a coloring agent | 0.1~0.5 weight % |
| a filler | 65~85 weight % |
| a releasing agent | 0.1~1.0 weight % |
| a flame retardant agent | 0.5~3.0 weight % |
| a stress lowering agent | 1.0~10.0 weight % |

It is preferred that the resin composition of the present invention has the above-mentioned composition, and that as the epoxy resin, o-cresol novolac resin having the excellent heat resistance is used, and in particular, the highly pure epoxy resin having an epoxy equivalent of 190 to 220 and a content of impurity up to 10 ppm is used.

As a curing agent, it is preferred to use a phenol novolac-like resin having a softening point of 80° to 100° C., a hydroxyl equivalent of 100 to 120 and a content of impurity up to 10 ppm.

Meanwhile, the maleimide-modified epoxy resin to be used markedly in the present invention is a novolac-like epoxy resin having the maleimide group as indicated in the general formula (I), and it is used in the amount of 0.1 to 30 weight %, preferably 1 to 10 weight % on the basis of the entire resin composition.

In the case of less than 0.1 weight %, the heat resistance effect of the resin is not exhibited, and in the case of more than 30 weight %, the moldability is deteriorated due to the resin bleed and the molding contamination, and there are many problems on the gellation time and the post-curing condition.

As a filler to be used in the present invention, it is preferred to use the highly pure fused silica having an average particle size of 10 to 30 μm. As a curing catalyst, amines, imidazole derivatives and organicphosphinic compounds are commonly used, and in the present invention as an organicphosphinic compound and an imidazole derivative, it is preferred to use triphenylphosphine and 2-methylimidazole, 2-methyl-4-methylimidazole and 2-heptadecylimidazole, respectively.

As a coupling agent to be used for treating a surface of an inorganic filler in the present invention, a silane coupling agent, in particular, γ-glycidoxypropyl trimethoxysilane is used. Also, as a stress lowering agent, a silicone rubber or an epoxy-modified silicone oil is commonly used, and in order to enhance the compatibility with high integration of a semiconductor, it is preferred to use an epoxy-modified silicone oil in the present invention.

In this addition, as a releasing agent, and a coloring agent, 0.1 to 1.0 weight % of Carnauba Wax or Montane Wax, and 0.1 to 0.5 weight % of carbon black, respectively are used, and as a frame-retardant agent, a brominated ethoxy resin and $Sb_2O_3$ are used.

In order to prepare the above composition of the present invention, an inorganic filler is treated with a coupling agent, the other agent are uniformly mixed in Henschell mixer or Lödige mixer, the reactants are melted and mixed by kneader or roll mill at 90° to 110° C. for 5 to 15 minutes, and they are cooled and powdered by a grinding machine.

In sealing a semiconductor element by using the above powdery composition, the composition in the form of powder is tableted in a tablet machine. Thus obtained resin composition in the form of a tablet is preheated by high frequency preheater, and thereafter, is molded by transfer molding press at 170° to 180° C. for 90 to 120 seconds to seal the semiconductor element.

As mentioned in the above, polyimide having the excellent thermal property in the prior art has the difficulties of the working conditions such as high temperature and long time and the unpracticalness in view of the cost. Accordingly, if in the present invention a new modified epoxy resin in which the maleimide group is incorporated into the epoxy resin of the prior art is prepared and added in the heat-resistant resin composition consisting of the epoxy resin/the maleimide resin, since the improvement of the bonding property and compatibility between the epoxy resin and the maleimide resin can be expected, maleimides which do not have good compatibility on the epoxy resin, but is inexpensive can be added. Thus obtained heat-resistant resin composition can have an improved heat resistance due to uniform dispersion and an uniform distribution of the physical property. Also, since the resin composition prepared by using the maleimide-modified epoxy resin as a heat resistance-improving agent has a superior heat resistance over that of the prior art, it prevent the package from the forming of crack in reflow soldering and enhance the moldability such as the release characteristics and molding contamination which are problems caused by using an aromatic imide compound of the prior art, and therefore, the resin composition useful for sealing a semiconductor element can be provided.

Now, the following working examples illustrate more specifically the present invention, but it should not be considered as being that the present invention is limited to the working examples.

EXAMPLES 1 TO 8

[The synthesis of monomaleimide]

0.2 mole of p-amino benzoic acid in dimethylformimide (DMF) are stirred while adding gradually 0.2 mole of maleic anhydride for 15 minutes therein, and thereafter, the reactants are maintained under $N_2$ atmosphere up to 15° C. while the stirring is effected for 1 hour.

The dehydration and cyclization of an amic acid which is an intermediate of maleimide is effected by adding 25 g of sodium acetate and 50 ml of acetic anhydride, reacting them at 45° C. for 2 hours, precipitating and washing with ice-water to obtain yellow p-carboxyphenylmaleimide.

[The preparation of the modified epoxy resin]

o-cresol novolac epoxy resin (EOCN, 1020; epoxy eq 202) and p-carboxyphenylmaleimide synthesized in the above with varying their respective equivalent ratio as indicated in Table 1 are reacted at 130° C. for 45 minutes to obtain the respective products in which the maleimide groups are incorporated into the epoxy resins.

Then, the materials are mixed as indicated in the following and cured at 120° C. for 3 hours and at 200° C. for 4 hours to obtain a heat-resistant resin, and the physical properties of the obtained heat-resistant resin are measured (See: Table 1).

|  | (PHR) |
| --- | --- |
| o-cresol novolac epoxy (EOCN 1020) | 70.0 |
| maleimide (MB 3000/MP 2000 X) | 30.0 |
| a modified epoxy resin addditive | 20.0 |
| a phenol novolac resin (PSM-4261) | 40.0 |
| a curing promoter (triphenylphosphine; TPP) | 1.5 |

Comparative Examples 1 to 2

The same method as that of the above examples is effected except that diaminodiphenyl methane (DDM) is used instead of the modified epoxy resin, and MP 2000 X and MB 3000 are used as maleimide. The results of the measurement on the physical properties according to the examples of the present invention and the comparative examples are shown in the following Table 1.

EXAMPLES 9 TO 11

As indicated in Table 2, the constitutional components are mixed uniformly in Henschell mixer to obtain a primary composition in the form of powders. And then, the primary composition is melt and kneaded with kneader, cooled and ground to obtain an epoxy resin molding material.

The physical properties of the obtained epoxy resin composition are measured with the following methods and the results are shown in Table 3.

1) Spiral flow: measured at the molding temperature of 175° C. and the molding pressure of 70 $kgf/cm^2$ by using the molding to be prepared according to EMMI standards.
2) Glass transition temperature (Tg): measured by using TMA measuring equipment.
3) The modulus of elasticity $E(kgf/mm^2)$: measured according to ASTM D190 by using UTM.
4) The coefficient of thermal expansion $\alpha(°C.^{-1})$: measured according to ASTM D696.
5) The bending strength $F(kgf/mm^2)$: measured according to ASTM D190 by using UTM.
6) The heat resistance test on the soldering by VPS: The observation of the crack after leaving in the vapor soldering bath at 215° C. for 1 min.
7) The degree of the molding contamination: The possible maximum number of molding when no molding cleaning agent is used.

Comparative Examples 3 to 4

By using the same method as that of examples 9 to 11 with the composition as indicated in Table 2, the physical properties are measured and the results are shown in Table 3.

TABLE 1

|  | Example | | | | | | | | Comparative example | |
| --- | --- | --- | --- | --- | --- | --- | --- | --- | --- | --- |
|  | 1 | 2 | 3 | 4 | 5 | 6 | 7 | 8 | 1 | 2 |
| epoxy resin maleimide | 70 | 70 | 70 | 70 | 70 | 70 | 70 | 70 | 70 | 70 |
| *MB 3000 | 30 | 30 | 30 | 30 | — | — | — | — | 30 | — |
| *MB 2000X | — | — | — | — | 30 | 30 | 30 | 30 | — | 30 |
| the modified epoxy resin (epoxy/maleimide) | | | | | | | | | | |
| 1/1 | 20 | — | — | — | 20 | — | — | — | — | — |
| 3/2 | — | 20 | — | — | — | 20 | — | — | — | — |
| 2/1 | — | — | 20 | — | — | — | 20 | — | — | — |
| 3/1 | — | — | — | 20 | — | — | — | 20 | — | — |
| DDM | — | — | — | — | — | — | — | — | 20.4 | 24.8 |
| phenol novolac resin (PSM-4261) | 40 | 40 | 40 | 40 | 40 | 40 | 40 | 40 | 40 | 40 |
| curing promoter (TPP) | 1.5 | 1.5 | 1.5 | 1.5 | 1.5 | 1.5 | 1.5 | 1.5 | 1.5 | 1.5 |
| *HDT (°C.) | 208 | 212 | 209 | 198 | 210 | 265 | 251 | 223 | 196 | 187 |
| TGA (°C.) 10° C./min | | | | | | | | | | |
| 5 wt % loss | 320 | 349 | 354 | 324 | 363 | 362 | 352 | 348 | 348 | 343 |
| 10 wt % loss | 330 | 369 | 367 | 343 | 370 | 392 | 381 | 377 | 369 | 360 |
| Tg | 230 | 230 | 212 | 210 | 255 | 263 | 231 | 211 | 210 | 202 |

*Note:
TGA: measured in 5° C./min at Stanton Redcraft STA 1500.
HDT: measured according to ASTM-D-648.
MP 3000: a bismaleimide compound available from Mitsubishi Petrochemical Co., Ltd.
MP 2000X: a multifunctional maleimeide available from Mitsubishi Petrochemical Co., Ltd.

TABLE 2

|  | Example 9 | Example 10 | Example 11 | Comparative Example 3 | (Unit: wt %) Comparative Example 4 |
| --- | --- | --- | --- | --- | --- |
| o-cresol novolac | 14.57 | 13.07 | 8.07 | 14.57 | 13.07 |
| phenol novolac | 5.83 | 5.83 | 5.83 | 5.83 | 5.83 |
| triphenylphosphine | 0.38 | 0.38 | 0.38 | 0.38 | 0.38 |
| fused silica | 73.8 | 73.8 | 73.8 | 73.8 | 73.8 |
| epoxy-modified silicone oil | 1.15 | 1.15 | 1.15 | 1.15 | 1.15 |
| brominated epoxy | 1.3 | 1.3 | 1.3 | 1.3 | 1.3 |
| KBM4031 (Nippon Shinetsu Chemical Co., Ltd.) | 1.11 | 1.11 | 1.11 | 1.11 | 1.11 |
| carnauba wax | 0.23 | 0.23 | 0.23 | 0.23 | 0.23 |
| $Sb_2O_3$ | 0.85 | 0.85 | 0.85 | 0.85 | 0.85 |
| carbon black | 0.26 | 0.26 | 0.26 | 0.26 | 0.26 |
| maleimide-modified epoxy resin | 0.5 | 2 | 7 | — | — |
| maleimide(MB-3000H, Mitsubishi Petrochemical Co., Ltd) | — | — | — | — | 2 |
| Kerimid 3561 (Nippon Polyimide Co., Ltd.) | | | | | |

MP 3000: a bismaleimide compound available from Mitsubishi Petrochemical Co., Ltd.
MP 2000X: a multifunctional maleimeide available from Mitsubishi Petrochemical Co., Ltd.

TABLE 3

|  | Example 9 | Example 10 | Example 11 | Comparative Example 3 | Comparative Example 4 |
| --- | --- | --- | --- | --- | --- |
| Spiral flow | 45 | 43 | 43 | 40 | 38 |
| Tg(°C.) | 185 | 190 | 202 | 180 | 185 |
| E(kgf/mm$^2$) | 1200 | 1300 | 1300 | 1200 | 1300 |
| $\alpha(\times 10^{-5}/°C.)$ | 1.8 | 1.7 | 1.6 | 1.8 | 1.8 |
| F(kgf/mm$^2$) | 13.0 | 13.0 | 14.0 | 13.0 | 13.0 |
| VPS heat-resistance test* | 2/600 | 0/600 | 0/600 | 10/600 | 10/600 |
| molding contamination** | 500 | 600 | 600 | 100 | 50 |

*The denominator among the numbers of VPS heat resistance test represents the number of the sample and the numerator represents the number of the inferior sample.
**The possible maximum number of molding without the use of the molding cleaning agent.

As can be seen from the results in Table 3, since the resin composition of the present invention has the superior moldability and heat resistance over the aromatic bismaleimide of the comparative examples, it is an excellent resin composition for sealing a semiconductor element having the improved impact-resistance strength of VPS condition and molding contamination.

What is claimed is:

1. An epoxy resin composition for sealing a semi-conductor element, comprising the following distinct components:
   (a) an epoxy resin;
   (b) a curing agent;
   (c) a curing catalyst;
   (d) a stress lowering agent; and
   (e) a heat resistance-improving agent comprising a maleimide modified epoxy resin having the general formula (I)

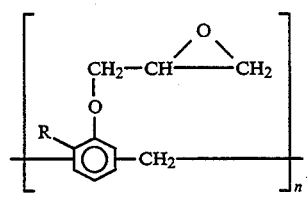

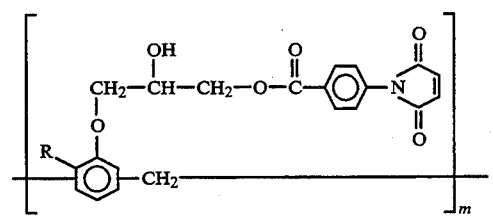

(I)

, wherein R is a hydrogen atom or an alkyl group having from 1 to 10 carbons ($C_1$ to $C_{10}$), n is 1 to 100, and m is 1 to 100.

2. The composition of claim 1, wherein the maleimide-modified epoxy resin has a ratio of n:m of about 1:1 to 3:1.

3. The composition of claim 1, comprising about 0.1 to 30 wt % maleimide-modified epoxy resin.

4. The composition of claim 1, comprising about 0.1–15 wt % epoxy resin, about 4–10 wt % curing agent, about 0.1–0.8 wt % curing catalyst, about 1.0–10.0 wt % stress lowering agent, and about 0.1–50 wt % maleimide-modified epoxy resin.

5. The composition of claim 1, wherein the epoxy resin is a diglycidyl ether of bisphenol A, a phenol novolac epoxy resin, or a cresol novolac epoxy resin.

6. The composition of claim 1, wherein the curing agent is a phenol novolac resin.

7. The composition of claim 1, wherein the curing catalyst is a tertiary amine, a tertiary amine salt, a quaternary ammonium salt, an imidazole, or an organic phosphine.

8. The composition of claim 7, wherein the curing catalyst is a tertiary amine or salt thereof, or an imidazole.

9. The composition of claim 1, wherein the curing catalyst is triphenylphosphine, 2-methylimidazole, 2-methyl-4-methylimidazole or 2-heptadecylimidazole.

10. The composition of claim 1 wherein the stress lowering agent is a silicone rubber or an epoxy modified silicone oil.

11. The composition of claim 1, further comprising: a coupling agent, a coloring agent, a filler, a releasing agent, or a flame-retardant agent.

* * * * *

UNITED STATES PATENT AND TRADEMARK OFFICE
CERTIFICATE OF CORRECTION

PATENT NO. : 5,428,057

DATED : June 27, 1995

INVENTOR(S) : Kim et al.

It is certified that error appears in the above-identified patent and that said Letters Patent is hereby corrected as shown below:

Col. 9, line 39 "KBM4031" should read --KBM403$^1$--

Col. 9, line 21 insert --*-- before the letters "TGA"

Col. 9, lines 23-24 delete "MP3000: a bismaleimide compound available from Mitsubishi Petrochemical Co. Ltd. MP2000X: a multifunctional maleimide available from Mitsubishi Petrochemical Co. Ltd." (footnote of Table 2)

Col. 9, line 23 insert --$^1$KBM403 is a commercially available silane coupling agent--

Col. 12, line 26 "1" should read --7--

Signed and Sealed this

Twenty-fourth Day of December, 1996

Attest:

BRUCE LEHMAN

Attesting Officer    Commissioner of Patents and Trademarks